(12) United States Patent
Parker et al.

(10) Patent No.: US 8,155,389 B2
(45) Date of Patent: Apr. 10, 2012

(54) METHOD AND SYSTEM FOR MOTION CORRECTION IN IMAGING SYSTEMS

(75) Inventors: Dennis Lee Parker, Centerville, UT (US); Evgueni G. Kholmovski, Salt Lake City, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 858 days.

(21) Appl. No.: 12/190,287

(22) Filed: Aug. 12, 2008

(65) Prior Publication Data

US 2009/0087057 A1 Apr. 2, 2009

Related U.S. Application Data

(60) Provisional application No. 60/976,910, filed on Oct. 2, 2007.

(51) Int. Cl.
*G06K 9/00* (2006.01)
(52) U.S. Cl. ........................ 382/107; 382/128
(58) Field of Classification Search .................. 382/107, 382/128, 131, 132; 324/307, 309
See application file for complete search history.

(56) References Cited

U.S. PATENT DOCUMENTS

| | | | |
|---|---|---|---|
| 5,825,185 A * | 10/1998 | Liu et al. | 324/309 |
| 6,076,004 A * | 6/2000 | Kanayama et al. | 600/410 |
| 6,292,683 B1 | 9/2001 | Gupta et al. | |
| 6,518,759 B2 * | 2/2003 | Bernstein | 324/307 |
| 6,798,199 B2 * | 9/2004 | Larson et al. | 324/309 |
| 6,900,631 B2 | 5/2005 | Bydder et al. | |
| 7,102,348 B2 * | 9/2006 | Zhang et al. | 324/309 |
| 7,239,136 B2 | 7/2007 | Sussman | |
| 7,358,732 B2 * | 4/2008 | Van Der Kouwe et al. | 324/309 |
| 2007/0205769 A1 | 9/2007 | Yui et al. | |

OTHER PUBLICATIONS

Blaimer, et al., "SMASH, SENSE, PILS, GRAPPA How to Choose the Optimal Method," *Top Magn Reson Imaging*, vol. 15, No. 4, Aug. 2004.
Bydder et al., "SMASH Navigators," *Magnetic Resonance in Medicine* 49:493-500 (2003).

* cited by examiner

*Primary Examiner* — Tom Y Lu
(74) *Attorney, Agent, or Firm* — Bell & Manning, LLC (57) ABSTRACT

A method, a system, and a computer-readable medium are provided which perform motion correction of image data. A first set of data and a second set of data of k-space data of an object to be imaged are received. The first set of data and the second set of data include a plurality of phase encoded lines that encompass the object to be imaged. The first set of data correlates with the second set of data. A cross-correlation is calculated by multiplying the first set of data and the second set of data in k-space. A value of the motion of the object to be imaged that occurred between acquisition of the first set of data and acquisition of the second set of data is calculated using the cross-correlation. The second set of data is corrected using the calculated value to remove the motion. The correction process is repeated until the k-space data is completely processed.

19 Claims, 7 Drawing Sheets

METHOD AND SYSTEM FOR MOTION CORRECTION IN IMAGING SYSTEMS

CROSS-REFERENCE TO RELATED PATENT APPLICATIONS

The present application claims priority to U.S. Provisional Application No. 60/976,910, filed Oct. 2, 2007, the entire disclosure of which is incorporated herein by reference.

REFERENCE TO GOVERNMENT RIGHTS

This invention was made with United States government support awarded by the following agencies: National Institute of Health Grant Nos. HL 48223 and HL 57990. The United States government has certain rights in this invention.

FIELD

The field of the disclosure relates generally to imaging systems. More specifically, the disclosure relates to motion correction of data in a magnetic resonance imaging system.

BACKGROUND

Magnetic resonance imaging (MRI) is an important diagnostic and imaging technique. MRI techniques are based on the absorption and emission of radio frequency (RF) energy by the nuclei of atoms. Typically, an object of interest is placed in a strong magnetic field that causes the generally disordered and randomly oriented nuclear spins of the atoms to become aligned with the applied magnetic field. One or more RF pulses are transmitted into the object, perturbing the nuclear spins. As the nuclear spins relax to their aligned state, the nuclei emit RF energy that is detected by one or more receiving coils disposed about the object. The received RF energy is processed into a magnetic resonance image of the object.

By utilizing non-uniform magnetic fields having gradients in each of three spatial dimensions, the location of the emitting nuclei can be spatially encoded so that the object can be imaged in three dimensions (3-D). The three dimensions are commonly two mutually orthogonal directions x and y defined in a plane denoted as a "slice" with a series of slices defined in a third mutually orthogonal direction z. As used herein, the x-direction is associated with a frequency-encoding (FE) direction, and the y-direction is associated with a phase-encoding (PE) direction. Generally, RF pulses having a range of frequencies are transmitted into the object, and through use of well-known frequency encoding (e.g., for the x-direction) and phase encoding techniques (e.g., for the y-direction), a set of MRI data is received by each of the one or more receiver coils for each slice of the object.

The resulting MR signal is a mix of RF waves with different amplitudes, frequencies, and phases which contain spatial information. The MR signal is digitized and raw data are written into a data matrix called k-space. K-space data are equivalent to a Fourier plane. Therefore, to create an image from k-space data requires use of a 2-D inverse Fourier transform. Thus, MRI data provide a representation of the MRI image in the frequency or k-space domain, where $k_x$ and $k_y$ are the spatial frequency variables in the x and y directions having units of cycles per unit distance. An image of the slice of the object is obtained by determining the inverse Fourier transformation of the k-space MRI data. In MRI systems having multiple receiver coils (parallel MRI), an image is reconstructed from each receiver coil, and a final image is a combination of the images from each coil. Multiple receiver coil systems can be used to achieve high spatial and temporal resolution, to suppress image artifacts, and to reduce MRI scan time. For example, dissimilarities in the spatial sensitivities of the multiple receiver coils can be used to reconstruct a full field of view (FOV) image with a reduced scan time as known to those skilled in the art.

Thus, in general, portions of the object to be imaged are scanned by a sequence of measurement cycles in which the magnetic field gradients, RF excitation pulse, and signal reading processes are varied based on the MRI imaging protocol selected. For each MRI scan, the resulting signals are digitized and processed to reconstruct the image in accordance with the MRI imaging protocol selected as known to those skilled in the art. For example, an MRI sequence of the MRI imaging protocol may be classified as a spin echo, a gradient echo, or a hybrid echo sequence with multiple variations within each classification. Additionally, a variety of reconstruction algorithms exist the use of which may depend on the MRI sequence selected as known to those skilled in the art. Exemplary reconstruction algorithms include SMASH, SENSE, GRAPPA, GRASE, PILS, SPACE RIP, etc. Additionally, the same line of k-space may be sampled multiple times to increase the signal-to-noise ratio (SNR) with a resulting increased scan time.

As a result, data acquisition for MR imaging can require a time period of several seconds to several minutes depending on the MRI imaging protocol selected. During the data acquisition time period, motion of the object being imaged such as the body of a patient may occur. Without corrective action, the motion produces artifacts that may degrade image quality. There are two types of artifacts due to motion: random movements which produce a blurry and noisy image, mainly in the PE direction, and periodic motion which creates ghost images in the PE direction. Motion artifacts mainly propagate in the PE direction due to movement of the spins between excitations or between the phase-encoding and the reading of the signal echo. Signal sampling and spatial-encoding in the FE direction generally is done so fast that physiological motion produces only a small amount of spatial blurring in the FE direction which can be removed without penalty, for example, using a bandpass filter.

To minimize the motion-related artifacts in the PE direction, a number of techniques have been developed. For example, the MR scan can be synchronized to the anatomical motion if the motion is known. Other techniques include the use of navigator echoes in which two different types of MR data are acquired. The first data type is used to form the MR image. The second data type is used to assess and compensate for the motion that occurs during the MRI data acquisition time period. The second data type may be acquired at regular intervals throughout the MRI data acquisition time period and interleaved with the data acquisition of the first data type. Data of the second data type is referred to as "navigator echoes".

Motion artifacts can be reduced by using navigator echoes to identify motion-corrupted measurements and to reacquire the identified motion-corrupted measurements when the anatomy is close to a baseline position. Motion correction with navigators can come at the expense of a substantial increase in scan time. A more time efficient method is to extract information of in-plane and through-plane displacements from the navigator echoes so that k-space data can be retrospectively corrected. However, navigator displacement measurements require a priori knowledge of the type of motion so that the navigator can be tailored to the specific type of motion. For example, spherical or orbital navigators may be used to detect bulk translation and rotation. Pencil-beam navigators can be used to detect local translational motion. PROPELLER MRI, proposed by J. G. Pipe, *Motion correction with PROPELLER MRI: application to head motion and free-breathing cardiac imaging*, Magn Reson Med 1999, 42(5), pp. 963-969, is a type of self-navigated data acquisition technique in which k-space data are acquired in blades to produce oversampling at the center of k-space. The oversampled k-space center acts as an inherent "navigator" to allow correction for in-plane bulk translation as well as rotation. The potential of parallel imaging techniques in removing or reducing motion artifacts has also been investigated. However, each of the current methods for removing or reducing motion artifacts has some drawbacks. What is needed, therefore, is a method and a system for motion correction of imaging data without some of the drawbacks of existing methods.

SUMMARY

In an exemplary embodiment, a method for performing motion correction of image data is provided. A first set of data and a second set of data of k-space data of an object to be imaged are received. The first set of data and the second set of data include a plurality of phase encoded lines that encompass the object to be imaged. The first set of data correlates with the second set of data. A cross-correlation is calculated by multiplying the first set of data and the second set of data in k-space. A value of the motion of the object to be imaged that occurred between acquisition of the first set of data and acquisition of the second set of data is calculated using the calculated cross-correlation. The second set of data is corrected using the calculated value to remove the motion.

In another exemplary embodiment, a computer-readable medium is provided comprising computer-readable instructions that, upon execution by a processor, cause the processor to perform the operations of the method of performing motion correction of image data.

In yet another exemplary embodiment, a system is provided. The system includes, but is not limited to, a processor and the computer-readable medium operably coupled to the processor. The computer-readable medium comprises instructions that, upon execution by the processor, perform the operations of the method of performing motion correction of image data.

Other principal features and advantages of the invention will become apparent to those skilled in the art upon review of the following drawings, the detailed description, and the appended claims.

BRIEF DESCRIPTION OF THE DRAWINGS

Exemplary embodiments of the invention will hereafter be described with reference to the accompanying drawings, wherein like numerals denote like elements.

FIG. 3b depicts an image reconstructed from a sixteenth echotrain using a turbo spin echo sequence, the sixteenth echotrain adjacent to the fifteenth echotrain of FIG. 3a.

DETAILED DESCRIPTION

Figure 1:
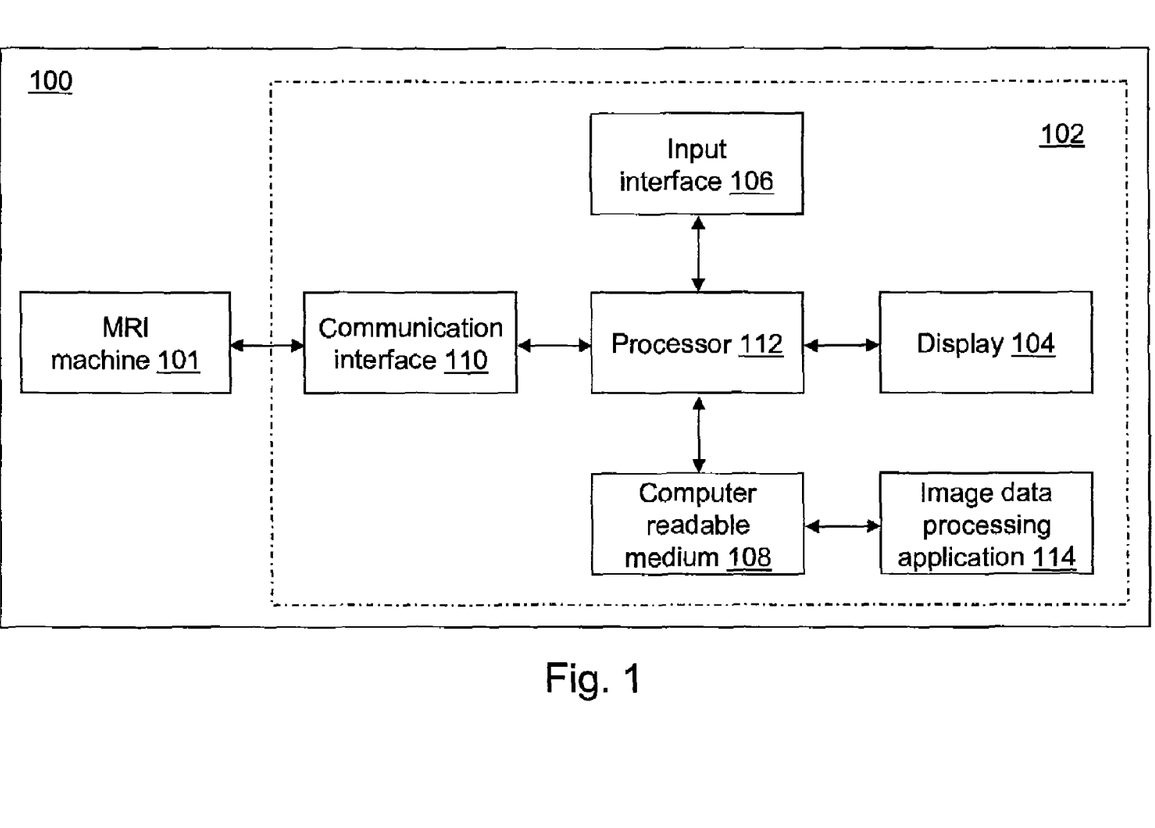
FIG. 1 depicts a block diagram of a magnetic resonance imaging (MRI) system in accordance with an exemplary embodiment.

With reference to FIG. 1, a block diagram of a magnetic resonance imaging (MRI) system 100 is shown in accordance with an exemplary embodiment. MRI system 100 may include an MRI apparatus 101 and a computing device 102. Computing device 102 may include a display 104, an input interface 106, a computer-readable medium 108, a communication interface 110, a processor 112, and an image data processing application 114. In the embodiment illustrated in FIG. 1, MRI machine 101 generates MRI k-space data. Computing device 102 may be a computer of any form factor. Different and additional components may be incorporated into computing device 102. Components of MRI system 100 may be positioned in a single location, a single facility, and/or may be remote from one another.

Display 104 presents information to a user of computing device 102 as known to those skilled in the art. For example, display 104 may be a thin film transistor display, a light emitting diode display, a liquid crystal display, or any of a variety of different displays known to those skilled in the art now or in the future.

Input interface 106 provides an interface for receiving information from the user for entry into computing device 102 as known to those skilled in the art. Input interface 106 may use various input technologies including, but not limited to, a keyboard, a pen and touch screen, a mouse, a track ball, a touch screen, a keypad, one or more buttons, etc. to allow the user to enter information into computing device 102 or to make selections presented in a user interface displayed on display 104. Input interface 106 may provide both an input and an output interface. For example, a touch screen both allows user input and presents output to the user.

Computer-readable medium 108 is an electronic holding place or storage for information so that the information can be accessed by processor 112 as known to those skilled in the art. Computer-readable medium 108 can include, but is not limited to, any type of random access memory (RAM), any type of read only memory (ROM), any type of flash memory, etc. such as magnetic storage devices (e.g., hard disk, floppy disk, magnetic strips, . . . ), optical disks (e.g., compact disk (CD), digital versatile disk (DVD), . . . ), smart cards, flash memory devices, etc. Computing device 102 may have one or more computer-readable media that use the same or a different memory media technology. Computing device 102 also may have one or more drives that support the loading of a memory media such as a CD or DVD.

Communication interface 110 provides an interface for receiving and transmitting data between devices using various protocols, transmission technologies, and media as known to those skilled in the art. The communication interface may support communication using various transmission media that may be wired or wireless.

Processor 112 executes instructions as known to those skilled in the art. The instructions may be carried out by a special purpose computer, logic circuits, or hardware circuits. Thus, processor 112 may be implemented in hardware, firmware, software, or any combination of these methods. The term "execution" is the process of running an application or the carrying out of the operation called for by an instruction. The instructions may be written using one or more programming language, scripting language, assembly language, etc. Processor 112 executes an instruction, meaning that it performs the operations called for by that instruction. Processor 112 operably couples with display 104, with input interface 106, with memory 108, and with communication interface 110 to receive, to send, and to process information. Processor 112 may retrieve a set of instructions from a permanent memory device and copy the instructions in an executable form to a temporary memory device that is generally some form of RAM. Computing device 102 may include a plurality of processors that use the same or a different processing technology.

Image data processing application 114 performs operations associated with constructing an image from imaging data such as MRI k-space data. Some or all of the operations described may be embodied in image data processing application 114. The operations may be implemented using hardware, firmware, software, or any combination of these methods. With reference to the exemplary embodiment of FIG. 1, image data processing application 114 is implemented in software stored in computer-readable medium 108 and accessible by processor 112 for execution of the instructions that embody the operations of image data processing application 114. Image data processing application 114 may be written using one or more programming languages, assembly languages, scripting languages, etc.

MRI machine 101 and computing device 102 may be integrated into a single system such as an MRI machine. MRI machine 101 and computing device 102 may be connected directly. For example, MRI machine 101 may connect to computing device 102 using a cable for transmitting information between MRI machine 101 and computing device 102. MRI machine 101 may connect to computing device 102 using a network. MRI imaging data may be stored electronically and accessed using computing device 102. MRI machine 101 and computing device 102 may not be connected. Instead, the MRI imaging data acquired using MRI machine 101 may be manually provided to computing device 102. For example, the MRI imaging data may be stored on electronic media such as a CD, a DVD, a flash drive, etc. After receiving the MRI imaging data, computing device 102 may initiate processing of the set of images that comprise an MRI study automatically or under control of an operator of computing device 102. MRI machine 101 may be an MRI machine of any form factor, manufacture, and model.

Figure 2:
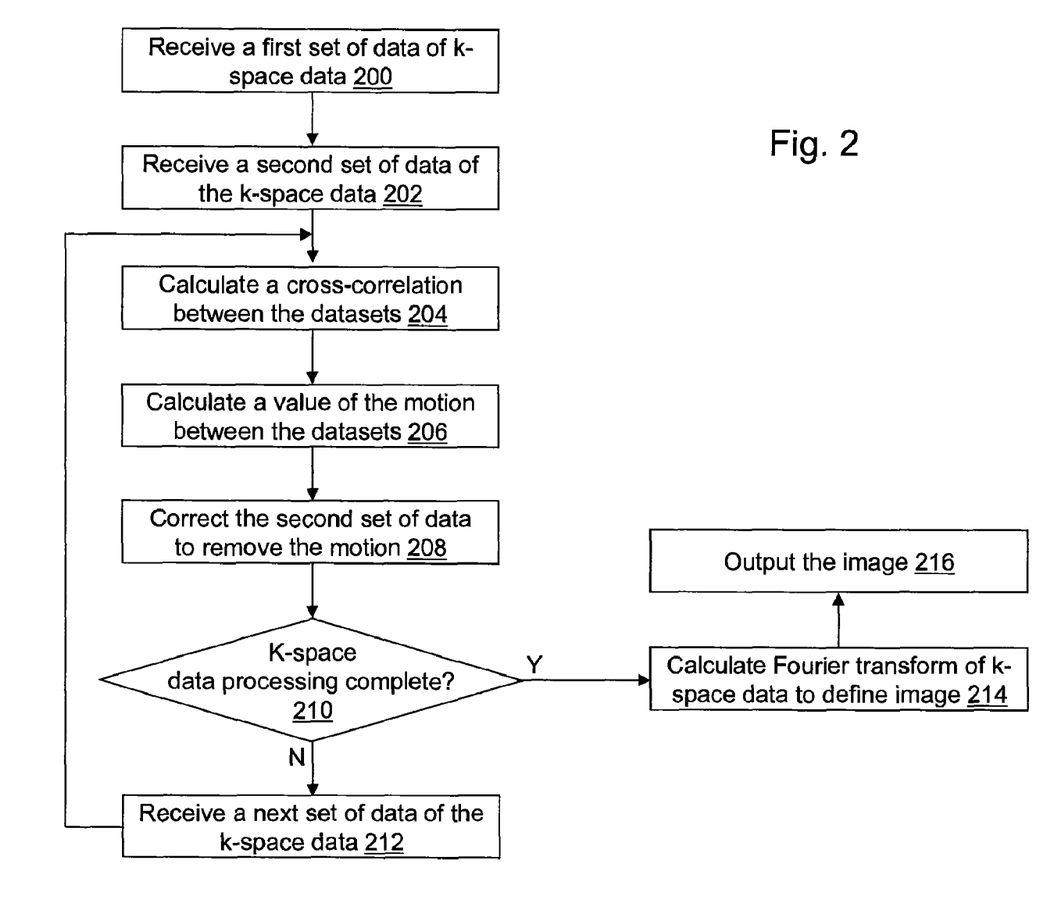
FIG. 2 depicts a flow diagram illustrating exemplary operations performed by the MRI system of FIG. 1 in accordance with an exemplary embodiment.

With reference to FIG. 2, exemplary operations associated with image data processing application 114 of FIG. 1 are described. Additional, fewer, or different operations may be performed, depending on the embodiment. The order of presentation of the operations of FIG. 2 is not intended to be limiting. In an operation 200, a first set of k-space data is received. For example, the k-space data may be stored at computing device 102 and a first set of k-space data selected for input to image data processing application 114 which receives the first set of k-space data as an input. As another alternative, the first set of k-space data may be streamed to computing device 102 from MRI machine 101 as the k-space data is generated by MRI machine 101 of an object being imaged. In an exemplary embodiment, MRI machine 101 is executing a turbo spin echo sequence in which multiple echoes are obtained in an echotrain. In this exemplary embodiment, the first set of k-space data is associated with a single echotrain. Other MRI sequences may be used such as spin echo, fast spin echo, gradient echo, ultrafast gradient echo, hybrid echo, echo planar imaging, etc.

The first set of k-space data includes a first plurality of phase encoded (PE) lines that encompass the object to be imaged where each PE line includes a plurality of frequency encoded (FE) points. The MRI protocol parameters selected result in k-space data that provides a field of view (FOV) that is larger than the object to be imaged. In an exemplary embodiment, the MRI protocol parameters selected result in k-space data that provides a FOV that is at least twice as large as the object to be imaged in the PE-direction. Aliasing does not occur if the FOV completely encompasses the body part to be imaged in the PE-direction. Using a no-phase wrap method aliasing is eliminated without signal-to-noise ratio (SNR) or spatial resolution penalties, but with an increased acquisition time. In an exemplary embodiment, the no-phase wrap method doubles the FOV in the PE-direction and doubles the number of PE steps to maintain the spatial resolution while reducing the number of averagings, if averaging is performed, of a k-space line by half. Because the total number of lines acquired remains constant, there is no change in SNR. The first set of k-space data is spread over k-space in the PE-direction. The first set of k-space data may be uniformly spread over k-space, randomly spread over k-space, or spread using any other technique.

In an operation 202, a second set of k-space data is received generally in a similar manner as the first set of k-space data is received. In an exemplary embodiment, the second set of k-space data is associated with a second echotrain and includes a second plurality of PE lines that encompass the object to be imaged where each PE line includes a plurality of FE points. The second set of k-space data also is spread over k-space in the PE-direction. The k-space lines of the second set of k-space data are chosen such that each k-space line of the second set is adjacent to a k-space line of the first set of k-space data. The second set of k-space data is shifted in a PE-direction relative to the first set of k-space data. The information in each adjacent k-space line overlaps by an amount equivalent to the ratio of the FOV to the object size in the PE-direction.

Figure 3A:
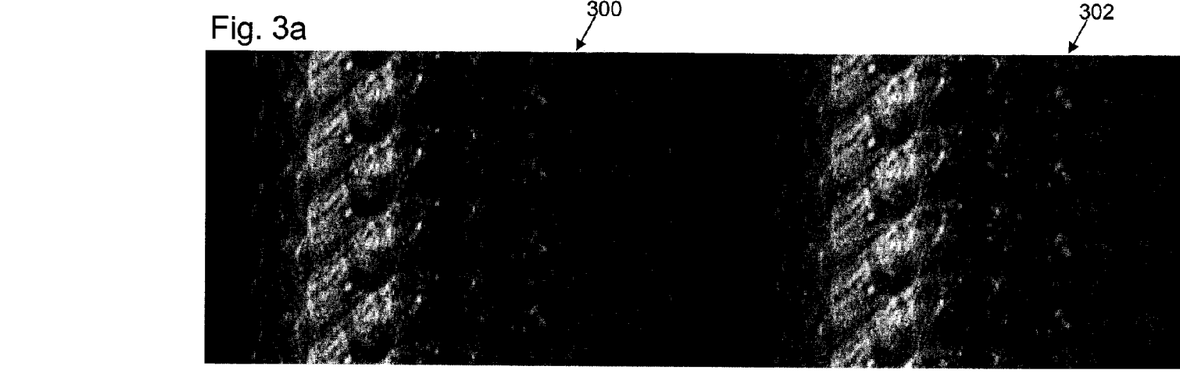
FIG. 3a depicts an image reconstructed from a fifteenth echotrain using a turbo spin echo sequence.
Figure 3B:
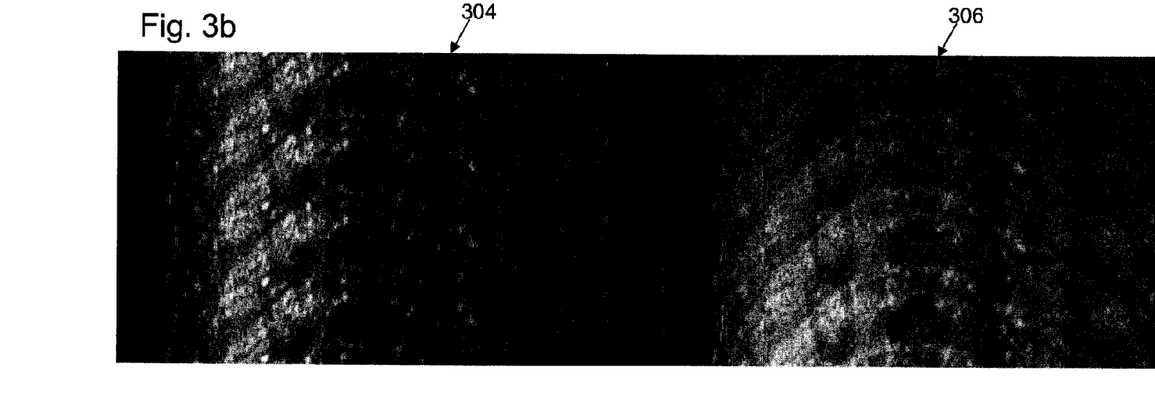

With reference to FIGS. 3a and 3b, two exemplary images are shown that were reconstructed using the measurements from a first echotrain and a second echotrain, respectively, with all other measurements set to zero. Highly aliased versions of the original image result as shown in FIGS. 3a and 3b. With reference to FIG. 3a, a first image 300 shows a magnitude image reconstructed from the first echotrain, and a second image 302 shows an image of the real component reconstructed from the first echotrain. With reference to FIG. 3b, a third image 304 shows a magnitude image reconstructed from the second echotrain, and a fourth image 306 shows an image of the real component reconstructed from the second echotrain. The second echotrain provides a set of k-space measurements adjacent to the first echotrain. The imaged object moved between the acquisition of the first echotrain and the acquisition of the second echotrain causing a shifted version of the aliased structure.

Simple translations can be detected using the cross-correlation of two images or the correlation of one image with the other. In the general case, this is denoted as shown in equation (1) below:

$$c_{x,y}=m_1(x,y)*_{x,y}m_2*(-x,-y) \quad (1)$$

where $m_1$ is the first image and $m_2$ is the 2nd image, and the superscript "*" means that the complex conjugate of $m_2$ is taken, (x,y) are the spatial locations and $*_{x,y}$ means convolution over the x and y directions, and c is the cross-correlation image. Equation (1) can be written in the Fourier domain as shown in equation (2) below:

$$C(k_x,k_y)=M_1(k_x,k_y)M_2*(k_x,k_y) \quad (2)$$

Where $M_1$ is the Fourier transform of $m_1$, $M_2$ is the Fourier transform of $m_2$, C is the Fourier transform of c, and $(k_x,k_y)$ are the Fourier transform variables that correspond to x and y. If $m_2$ is a shifted version of $m_1$ that is shifted by $\Delta x$ in the x direction and $\Delta y$ in the y direction then equation (2) can be rewritten as shown in equation (3) below:

$$C(k_x,k_y)=|M_1(k_x,k_y)|^2 e^{i(k_x \Delta x + k_y \Delta y)} \quad (3)$$

The offsets can be measured as the slopes of the phase in k-space. Also, the inverse transform of $C(k_x,k_y)$ is a Dirac delta function convolved with the transform of the magnitude square of $M_1$, and the shift of the delta function from the origin provides the image offset. The Dirac delta function is found more directly from phase correlation as shown in equation (4) below:

$$R(k_x, k_y) = \frac{M_1(k_x, k_y)M_2^*(k_x, k_y)}{|M_1(k_x, k_y)M_2^*(k_x, k_y)|} = e^{i(k_x \delta_x + k_y \delta_y)} \quad (4)$$

To avoid the zeroes of the different transforms, it is convenient to use a weighting designed to compensate for the transform magnitudes as shown in equation (5) below:

$$C(k_x,k_y)=W(k_x,k_y)|M_1(k_x,k_y)|^2 e^{i(k_x \delta_x + k_y \delta_y)} \quad (5)$$

The weighting flattens the magnitude of $C(k_x,k_y)$. The position of the sharp spike in the resulting inverse Fourier transform, however, still provides the shift between the two images.

MRI, in general, samples the Fourier transform of the desired image. Using a number of MRI protocols a small fraction of k-space is sampled closely spaced in time. It can be shown that if $C(k_x,k_y)$ is computed from an incomplete set of k-space measurements, the resulting c(x,y) still shows the original spike and a set of aliased spikes. If there is correlation between adjacent measurements in k-space, the cross-correlation can be used to determine the shift that occurred between acquisitions of the k-space measurements. If the object to be imaged does not fill the measured FOV, there is correlation between adjacent measurements in k-space. For example, an extended FOV is acquired so that there is correlation between adjacent measurements in k-space. The fact that the object has finite support in image space is equivalent to multiplication by a rectangular window in image space or convolution with a sinc-function in k-space. The width of the sinc function in k-space is inversely related to the width of the image support. In principle, a set of k-space lines can be defined midway between the two measured sets of k-space data as "j+½", with the measured lines designated at positions "j" and "j+1". The cross-correlation, $C_{k_x,k_{i,j+1/2}}$ can be written as shown in equation (6) below:

$$C_{k_x,k_{i,j+1/2}} = W_{k_x,k_{i,j}} M_{k_x,k_{i,j}} \cdot M^*_{k_x,k_{i,j+1}} = W_{k_x,k_{i,j}} |M_{k_x,k_{i,j}}|^2 e^{i(k_x \delta_{xj} + k_{ij} \delta_{yj})} \quad (6)$$

where $k_{i,j}=j+i \cdot n_{et}$ is the k-space PE index, j is the index of the echotrain, i is the index of the k-space line within the echotrain, and $n_{et}$ is the number of echotrains. j is not necessarily the time order of acquisition, nor is i necessarily the echo order within the echotrain. Based on this, a first set of k-space lines is shifted to match the position of a second set of k-space lines so that the product does not result in a value of zero. Thus, even though a first k-space line does not "physically" overlap with a second k-space line, the two k-space lines have a width that does overlap. As a result, a k-space line that is half-way between the two adjacent k-space lines is effectively created to place both k-space lines at the same location. This is repeated for all of the lines in each set of k-space lines, and the adjacent k-space lines are multiplied to calculate a cross correlation in image space. The FOV is selected to provide sufficient overlap of the widths such that the k-space lines correlate.

The Fourier transform of $C_{k_x,k_{i,j+1/2}}$ results in a set of delta functions that are replicated across the image. For example, if a turbo spin echo sequence is used, the set of delta functions are repeated $n_{et}$ times across the image where $n_{et}$ is the number of echotrains. As long as the motion shift in the image is smaller than $N/2n_{et}$, where N is the total number of lines in the PE direction and $N/n_{et}$ is the number of echoes in the echotrain, the motion of the object between the two acquisitions can be detected.

With continuing reference to FIG. 2, in an operation 204, a cross-correlation is calculated between the first set of k-space data and the second set of k-space data, for example, using equation (6). In an operation 206, a value of the motion between acquisition of the first set of k-space data and acquisition of the second set of k-space data is calculated based on the calculated cross-correlation. For example, an absolute position of the object at the time of each echotrain may be determined by integrating the shifts in the x-direction and y-direction, respectively, as shown in equation (7) below:

$$\Delta x_j = \sum_{j'=1}^{j} \delta_{xj'}, \quad \Delta y_j = \sum_{j'=1}^{j} \delta_{yj'} \quad (7)$$

In an operation 208, the second set of k-space data is corrected to remove the motion. Motion correction may be performed by applying a linear phase shift for each echotrain. That is, the measurements are multiplied by a complex number that can be written: $e^{-i(\Delta x_j k_x + \Delta y_j k_y)}$. In an operation 210, a determination is made concerning whether or not processing of the k-space data is complete. If processing of the k-space data is not complete, processing continues in an operation 212. If processing of the k-space data is complete, processing continues in an operation 214. In operation 212, a next set of k-space data is received and processing continues at operation 204 with the second set of k-space data replacing the first set of k-space data and with the next set of k-space data replacing the second set of k-space data. The next set of k-space data is received generally in a similar manner as the first set of k-space data is received. As a result, the value of the motion calculated is between adjacent k-space data acquisitions.

In an operation 214, an image is defined from the k-space data. For example, an inverse Fourier transform is applied to the corrected k-space data to define the image in image space. One or more additional slices of the object may be obtained after generation of the k-space data for the first slice or interleaved with generation of the k-space data. In an operation 216, the image is output. For example, the image may be presented to the operator of computing device 102 using display 104. Additionally, or in the alternative, the image may be printed using a printer. Additionally, or in the alternative, the image may be stored to computer-readable medium 108 at computing device 102 or accessible by computing device 102, for example, using communication interface 110.

Experiments were performed on a three Tesla MRI Trio Magnetom scanner (Siemens Medical Solutions, Erlangen, Germany) using a single channel wrist coil. Eleven high resolution, 2-D turbo spin echo images of a human hand were acquired. The parameters associated with the MRI protocol selected include a repetition time of 4000 milliseconds (ms), an echo time of 60 ms, with seventeen echoes/echotrain and thirty-one echotrains. The acquisition FOV was 120 millimeters (mm) with a slice thickness of 3 mm. The number of acquisitions in the FE-direction was 640, and the number of acquisitions in the PE-direction was 527 resulting in a spatial resolution of 0.1875 mm in the x-direction and 0.2277 mm in the y-direction. During the acquisition pass, the subject moved his hand occasionally.

Figure 6:
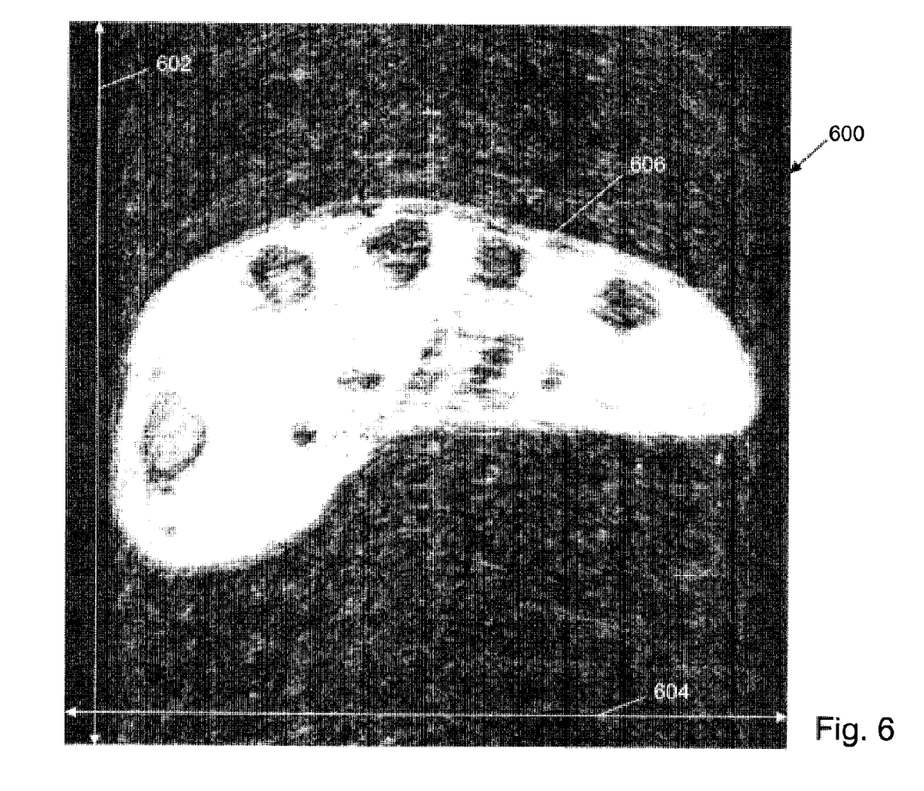
FIG. 6 depicts a single axial slice of a hand image obtained using a turbo spin echo sequence during which the hand moved causing blurring and ghosting.
Figure 7:
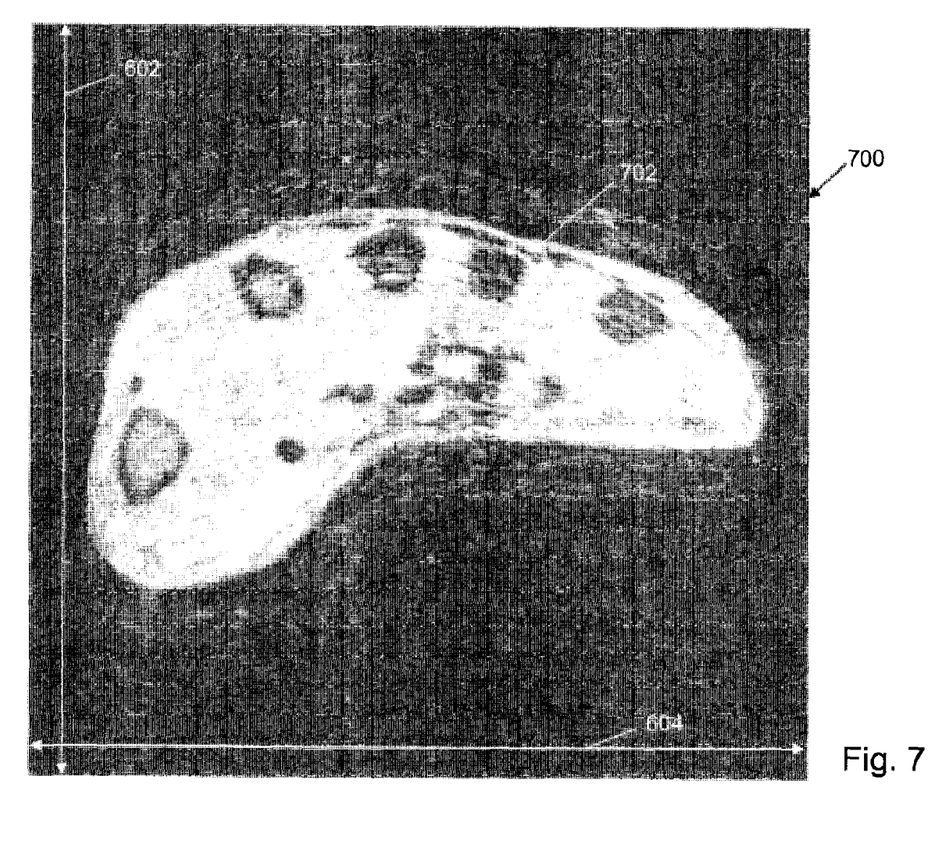
FIG. 7 depicts the single axial slice of the hand image of FIG. 6 calculated based on the operations of FIG. 2 in accordance with an exemplary embodiment to reduce the blurring and ghosting.

With reference to FIG. 6, an uncorrected image 600 is shown of the hand acquired during the acquisition pass which included motion of the hand and without correction to remove the motion. Uncorrected image 600 includes a first hand image 702 and has an x-dimension FOV 602 and a y-dimension FOV 604. The FOV in both the x- and y-directions encompassed the entire hand. The imaged object filled about ⅓ of the imaged FOV in the y- or PE-direction. For comparison and with reference to FIG. 7, a corrected image 700 is shown of the imaged object acquired during the acquisition pass which included motion of the hand and correction of the motion based on the operations described with reference to FIG. 2. Corrected image 700 includes a second hand image 702 and also has x-dimension FOV 602 and y-dimension FOV 604. Any blurring and ghosting shown with reference to second hand image 702 has been reduced in comparison with first hand image 606. Nine of the eleven slices of the acquisition pass contained signal and similar results were observed in each of the nine slices. The aliased images reconstructed from echotrains 7 and 8 are shown in FIGS. 3a and 3b, respectively.

Figure 4:
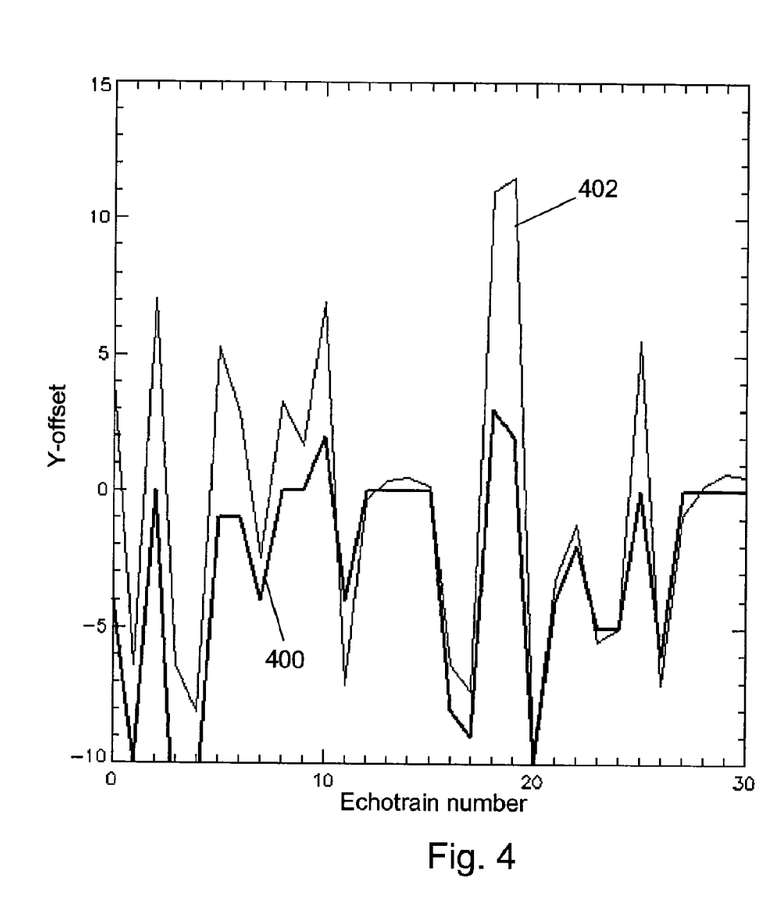
FIG. 4 depicts a graph of a y-direction motion correction value calculated based on the operations of FIG. 2 in accordance with an exemplary embodiment.
Figure 5:
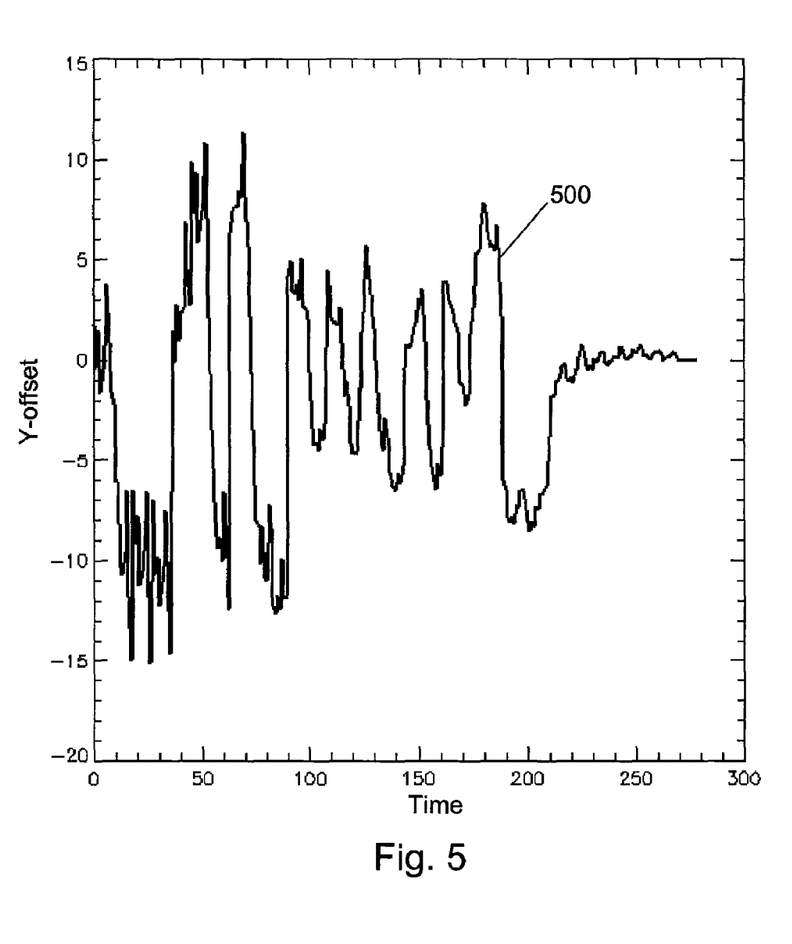
FIG. 5 depicts a graph of a y-direction motion correction value calculated based on the operations of FIG. 2 shown in chronological order in accordance with an exemplary embodiment.

With reference to FIG. 4, a curve 400 of the cumulative position shift in the y-direction for corrected image 700 is shown. Curve 400 was obtained based on the operations described with reference to FIG. 2. A curve 402 was obtained by visually shifting and aligning the aliased images. Curve 400 closely matches the visually corrected curve 402. The slices were acquired in an interleaved fashion. With reference to FIG. 5, an ordered curve 500 of the shift in the y-direction of the nine slices are shown in sequence. The shifts are relatively smooth, as expected, and show nine movements in the negative direction.

As described herein, MRI data can be self navigating under the circumstance that adjacent subsets of k-space measurements are correlated. The operations described with reference to FIG. 2 have application to both translational and rotational motion of rigid bodies and can apply where motion may not occur between adjacent subsets of k-space measurements.

The word "exemplary" is used herein to mean serving as an example, instance, or illustration. Any aspect or design described herein as "exemplary" is not necessarily to be construed as preferred or advantageous over other aspects or designs. Further, for the purposes of this disclosure and unless otherwise specified, "a" or "an" means "one or more". The exemplary embodiments may be implemented as a method, apparatus, or article of manufacture using standard programming and/or engineering techniques to produce software, firmware, hardware, or any combination thereof to control a computer to implement the disclosed embodiments.

The foregoing description of exemplary embodiments of the invention have been presented for purposes of illustration and of description. It is not intended to be exhaustive or to limit the invention to the precise form disclosed, and modifications and variations are possible in light of the above teachings or may be acquired from practice of the invention. The functionality described may be implemented in a single executable or application or may be distributed among modules that differ in number and distribution of functionality from those described herein. Additionally, the order of execution of the functions may be changed depending on the embodiment. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A system for performing motion correction of image data, the system comprising:
a processor; and
a computer-readable medium operably coupled to the processor, the computer-readable medium comprising instructions that, when executed by the processor, perform operations comprising
receiving a first set of data that is a first subset of k-space data of an object to be imaged, the first set of data including a first plurality of phase encoded lines that encompass the object to be imaged;
receiving a second set of data that is a second subset of the k-space data of the object to be imaged, the second set of data including a second plurality of phase encoded lines that encompass the object to be imaged, wherein the first set of data correlates with the second set of data and the second set of data is shifted in a phase-encode direction relative to the first set of data;
calculating a cross-correlation by multiplying the received first set of data and the received second set of data in k-space;
calculating a value of the motion of the object to be imaged that occurred between acquisition of the first set of data and acquisition of the second set of data using the calculated cross-correlation; and
correcting the second set of data to remove the motion using the calculated value.

2. The system of claim 1, further comprising an imaging apparatus configured to generate the first set of data and to generate the second set of data.

3. The system of claim 2, further comprising a communication interface operably coupled to the processor to receive the first set of data and the second set of data from the imaging apparatus.

4. A non-transitory computer-readable medium comprising computer-readable instructions therein that, when executed by a processor, cause a computing device to:
receive a first set of data that is a first subset of k-space data of an object to be imaged, the first set of data including a first plurality of phase encoded lines that encompass the object to be imaged;
receive a second set of data that is a second subset of the k-space data of the object to be imaged, the second set of data including a second plurality of phase encoded lines that encompass the object to be imaged, wherein the first set of data correlates with the second set of data and the second set of data is shifted in a phase-encode direction relative to the first set of data;

calculate a cross-correlation by multiplying the received first set of data and the received second set of data in k-space;

calculate a value of the motion of the object to be imaged that occurred between acquisition of the first set of data and acquisition of the second set of data using the calculated cross-correlation; and correct the second set of data to remove the motion using the calculated value.

5. A method of performing motion correction of image data, the method comprising:
(a) receiving a first set of data that is a first subset of k-space data of an object to be imaged, the first set of data including a first plurality of phase encoded lines that encompass the object to be imaged;
(b) receiving a second set of data that is a second subset of the k-space data of the object to be imaged, the second set of data including a second plurality of phase encoded lines that encompass the object to be imaged, wherein the first set of data correlates with the second set of data and the second set of data is shifted in a phase-encode direction relative to the first set of data;
(c) calculating a cross-correlation by multiplying the received first set of data and the received second set of data in k-space;
(d) calculating a value of the motion of the object to be imaged that occurred between acquisition of the first set of data and acquisition of the second set of data using the calculated cross-correlation; and
(e) correcting the second set of data to remove the motion using the calculated value.

6. The non-transitory computer-readable medium of claim 4, wherein the computer-readable instructions further cause the computing device to repeat (a)-(e) with the second set of data as the first set of data and with a third set of data that is a third subset of the k-space data as the second set of data until each subset of the k-space data is processed.

7. The non-transitory computer-readable medium of claim 4, wherein the computer-readable instructions further cause the computing device to repeat (a)-(e) with a third set of data that is a third subset of the k-space data as the second set of data until each subset of the k-space data is processed.

8. The non-transitory computer-readable medium of claim 4, wherein the k-space data provides a field of view that is at least twice as large as the object to be imaged in a phase-encode direction.

9. The non-transitory computer-readable medium of claim 4, wherein the computer-readable instructions further cause the computing device to define an image of the object using the first set of data and the corrected second set of data by calculating an inverse Fourier transform with the first set of data in combination with the corrected second set of data.

10. The non-transitory computer-readable medium of claim 9, wherein the computer-readable instructions further cause the computing device to output the defined image of the object wherein outputting the defined image comprises at least one of printing the defined image, displaying the defined image, and storing data associated with the defined image in a computer-readable medium.

11. The non-transitory computer-readable medium of claim 4, wherein the k-space data provides a field of view that is larger than the object to be imaged.

12. The non-transitory computer-readable medium of claim 11, wherein the k-space data provides a field of view that is at least twice as large as the object to be imaged in a phase-encode direction.

13. The non-transitory computer-readable medium of claim 4, wherein the first set of data is uniformly sampled in a phase-encode direction.

14. The non-transitory computer-readable medium of claim 4, wherein the first set of data is randomly sampled in a phase-encode direction.

15. The non-transitory computer-readable medium of claim 4, wherein the first set of data does not overlap with the second set of data in a phase-encode direction.

16. The non-transitory computer-readable medium of claim 4, wherein the first set of data is obtained in a first echotrain using a spin echo sequence.

17. The non-transitory computer-readable medium of claim 16, wherein the first echotrain includes a plurality of echoes.

18. The non-transitory computer-readable medium of claim 16, wherein the second set of data is obtained in a second echotrain using the spin echo sequence.

19. The non-transitory computer-readable medium of claim 4, wherein the calculated value is a linear phase shift and correcting the second set of data comprises applying the linear phase shift to the received second set of data.

* * * * *